US007010013B2

(12) United States Patent
Wang et al.

(10) Patent No.: US 7,010,013 B2
(45) Date of Patent: Mar. 7, 2006

(54) ASSEMBLY WITH TAPERED, THREADED FERRULE HOUSING FOR IMPROVED ALIGNMENT OF FIBER WITH LASER

(75) Inventors: Chung-Yung Wang, Sugar Land, TX (US); Hung-Lun Chang, Sugar Land, TX (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 188 days.

(21) Appl. No.: 10/428,390

(22) Filed: May 2, 2003

(65) Prior Publication Data

US 2004/0218656 A1    Nov. 4, 2004

(51) Int. Cl.
*H01S 3/08*    (2006.01)
(52) U.S. Cl. ........................................ 372/108; 385/88
(58) Field of Classification Search ................ 372/107, 372/6, 36, 108; 385/10, 88; 381/88
See application file for complete search history.

(56) References Cited

U.S. PATENT DOCUMENTS

| | | | | |
|---|---|---|---|---|
| 4,315,100 A | * | 2/1982 | Haslbeck et al. | 174/51 |
| 4,461,538 A | * | 7/1984 | Breed et al. | 385/88 |
| 5,169,122 A | * | 12/1992 | Sunderland | 251/148 |
| 6,594,435 B1 | * | 7/2003 | Tourne | 385/136 |
| 2004/0026757 A1 | * | 2/2004 | Crane et al. | 257/434 |

* cited by examiner

*Primary Examiner*—Minsun Oh Harvey
*Assistant Examiner*—Tod T. Van Roy
(74) *Attorney, Agent, or Firm*—N. Stephan Kinsella

(57) ABSTRACT

An assembly for improved alignment of a laser for generating laser light with an optical fiber having an end section terminating in a light-receiving end. A laser housing has a base and substantially cylindrical housing walls mounted at a bottom portion to the base. The laser can be mounted on the base. The substantially cylindrical internal surface of the cylindrical housing walls have internal threads at a top portion. The internal threads have a minor diameter and a major diameter. An annular ferrule housing has a substantially cylindrical through-hole with an inner diameter sufficient to receive a fiber ferrule which has the end section of the fiber disposed therein. The ferrule housing further has an axially tapered external surface having external threads which are threadably compatible with the internal threads. The major diameter of the external threads decreases monotonically from a first major diameter at a top portion of the external surface to a comparatively smaller second major diameter at a bottom portion of the external surface. The first major diameter of the external threads is larger, and the second major diameter of the external threads is smaller, than the minor diameter of the internal threads.

16 Claims, 4 Drawing Sheets

ASSEMBLY WITH TAPERED, THREADED FERRULE HOUSING FOR IMPROVED ALIGNMENT OF FIBER WITH LASER

BACKGROUND OF THE INVENTION

1. Field of the Invention

This invention relates to laser packaging and, in particular, to apparatuses and methods for optically coupling optical fibers to semiconductor lasers.

2. Description of the Related Art

The following descriptions and examples are not admitted to be prior art by virtue of their inclusion within this section.

There are several types of lasers, including gas lasers, solid-state lasers, liquid (dye) lasers, free electron, and semiconductor lasers. All lasers have a laser cavity defined by at least two laser cavity mirrors, and an optical gain medium in the laser cavity. The gain medium amplifies electromagnetic waves (light) in the cavity by stimulated emission, thereby providing optical gain.

In semiconductor lasers, a semiconductor active region serves as the gain medium. Semiconductor lasers may be diode (bipolar) lasers or non-diode, unipolar lasers such as quantum cascade (QC) lasers. Semiconductor lasers may also be edge-emitting lasers or surface-emitting lasers (SELs). Edge-emitting semiconductor lasers output their radiation parallel to the wafer surface, in contrast to SELs, in which the radiation output is perpendicular to the wafer surface, as the name implies. In conventional Fabry-Perot (FP) edge-emitting lasers, a cleaved facet mirror is used to obtain the feedback for laser oscillation. Other semiconductor lasers, such as distributed-feedback (DFB) and distributed-Bragg reflector (DBR) lasers, employ one or more diffraction gratings to provide reflectance.

Semiconductor lasers are used in a variety of applications, such as high-bit-rate optical fiber communications. In telecommunications applications, the laser often emits at a single lasing wavelength at 1.31 $\mu$m (and other closely spaced wavelengths), or at telecommunications wavelengths specified by the ITU grid, such as lasing wavelengths of 1.55 $\mu$m (and other closely spaced wavelengths). These wavelength ranges are often used for telecommunications purposes because the loss of silica fibers is comparatively low at these wavelengths.

Lasers must be optically coupled to fibers to engage in optical fiber communications. For example, a 1310 nm edge-emitting laser's output must be optically coupled into the input (light-receiving) end of an optical fiber in order to transmit a modulated optical signal via the fiber. It can be difficult, expensive, and time-consuming to properly couple the laser to the fiber. For example, it is difficult to accurately align the laser relative to the fiber or other optical device to which it is to be coupled, so that a sufficient amount of laser light output by the laser is coupled into the fiber.

In some conventional techniques, the laser and the light-receiving end of the optical fiber to which the laser is to be optically coupled are mounted together in a housing such as a TO (transistor outline) can, along with optics such as a lens disposed between the laser and the fiber end. The fiber end may be disposed in a rigid cylindrical ferrule, which is itself mounted inside a cylindrical ferrule housing. After the fiber is actively aligned to the laser, the alignment process is completed by mounting its ferrule housing to a laser housing such as a TO can housing by a variety of techniques such as laser welding, or by using an appropriate adhesive such as epoxy or glue. The use of laser welding can be expensive, complex, or otherwise undesirable, and epoxy can fall into the interior of the TO can housing, thus contaminating the optics. Additionally, conventional techniques may not result in a sufficiently strong bond between the TO can housing and ferrule housing, thus reducing the durability and/or lifetime of the packaged device.

BRIEF DESCRIPTION OF THE DRAWINGS

Other features and advantages of the invention will become apparent upon study of the following description, taken in conjunction with the attached FIGS. 1–4.

DETAILED DESCRIPTION OF THE INVENTION

In order to optically couple a laser to an optical fiber, they must be aligned with respect to each other so that, during operation, laser light output from the laser is coupled into the input (light-receiving) end of the fiber sufficient for a laser light signal to be transmitted via the fiber. The signal is produced by appropriately modulating the laser light generated by the laser, for example by direct modulation.

The present invention provides a method and assembly comprising a tapered, threaded ferrule housing and a corresponding internally threaded TO can housing, for providing improved alignment of a laser with respect to a fiber, to optically couple the laser to the fiber.

Figure 1:
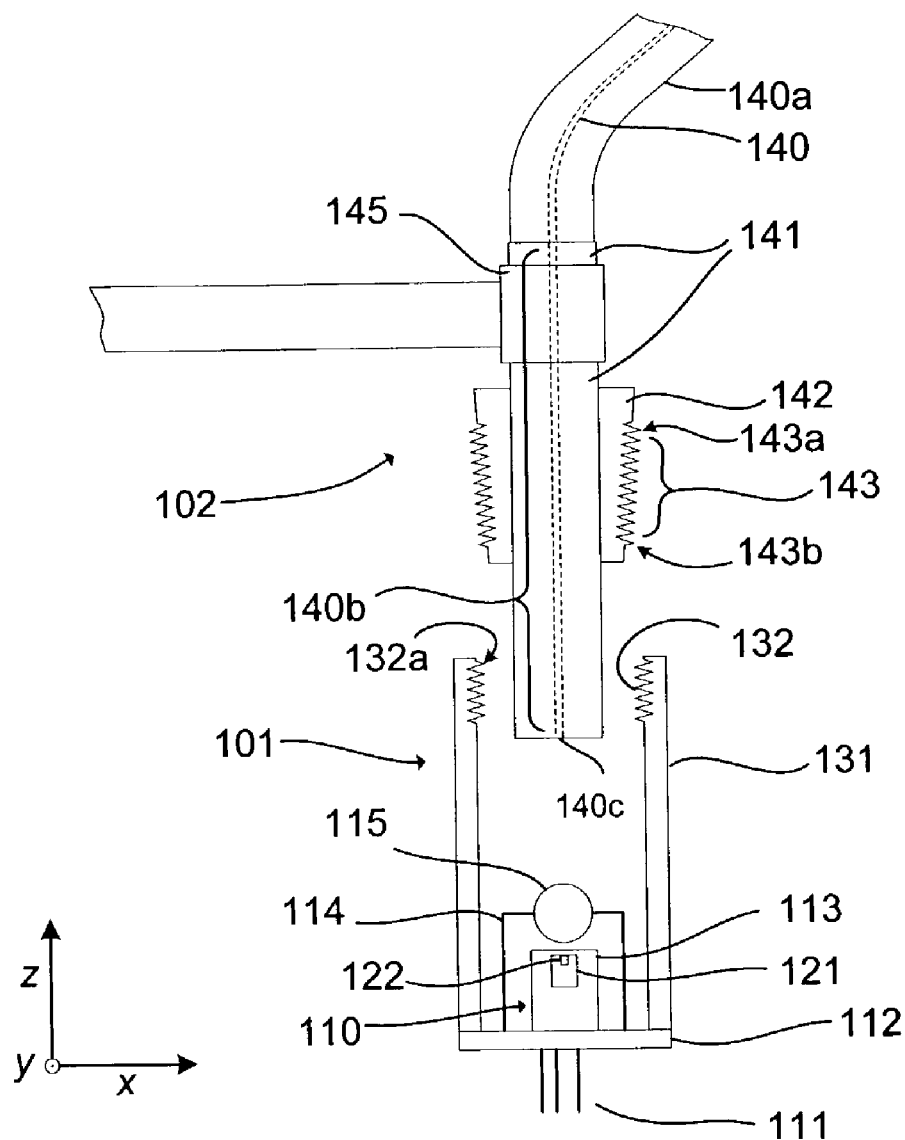
FIG. 1 is a cross-sectional view of an assembly including an internally threaded TO can housing, and a fiber portion having a tapered, externally-threaded ferrule housing for improved alignment of a laser with a fiber, in accordance with an embodiment of the present invention.

Referring now to FIG. 1, there is shown in cross-section an assembly 100 including an internally threaded (i.e., female) laser housing 101, and a fiber portion 102 having a tapered, externally-threaded ferrule housing 142, in accordance with an embodiment of the invention (dimensions shown not necessarily to scale).

In an embodiment, laser housing 101 is a TO can housing 101 comprising a substantially round base 112 and substantially cylindrical housing walls 131 mounted to base 112. TO can housing 101 preferably has a laser mounting feature or platform such as a TO can comprising TO header 110 and TO cap 114, also mounted to base 112, for receiving and mounting a laser 122 and associated optics such as lens 115. TO header 110 comprises TO can post 113, also mounted to base 112, and electrical connection pins 111, which are electrically connected to TO can post 113 and which extend down through the bottom of base 112. TO cap 114 is mounted on base 112, around and over the TO can post 113. Lens 115 is disposed in a central opening in the top portion of TO cap 114. A laser submount 121, having laser 122 mounted thereon, is mounted on the TO can post 113, so that laser 122 emits its output laser radiation upward, into the intermediate lens 115, during operation thereof. Lens 115 may be any suitable lens, such as an aspherical lens or ball lens. In alternative embodiments, other optical components (not shown) may be employed, instead of, or in addition to, lens 115. In alternative embodiments, a laser mounting platform other than a TO can may be employed.

Fiber portion 102 comprises the optical fiber 140 to which laser 122 is to be optically coupled, and other components used to mount fiber 140 with respect to laser 122, such as fiber ferrule 141 and ferrule housing 142. Fiber 140 has an end section 140b disposed in a rigid cylindrical ceramic ferrule 141. Ferrule 141 may also be made of other materials, such as metal or plastic. Ferrule 141 has a tubular (cylindrical) ferrule body having a cylindrical outer surface and a through-hole formed therethrough with an inner diameter sufficient to receive and hold fiber end section 140b of the optical fiber 140, with optical fiber end section 140b disposed along the central axis of ferrule 141. Fiber end section 140b terminates in an input (light-receiving) end 140c. The portion of fiber 140 extending outside and beyond ferrule 141 will typically be disposed in fiber optical cable outer jacket 140a. Ferrule 141 has front (bottom) and back (top) ends, where the bottom end is the end having input fiber end 140c, and the top end is the end abutting fiber outer jacket 140a.

Ferrule 141 is disposed in tapered, annular, externally-threaded (i.e., male) ferrule housing 142, which has external threads 143 on the tapered external surface thereof. Ferrule housing 142 has a cylindrical through-hole formed therethrough with an inner diameter sufficient to receive and hold ferrule 141 with a close fit but loose enough so that ferrule housing 142 is able to be moved axially up and down with respect to ferrule 141, during the alignment process. Thus, the ID of ferrule housing 142 is close to, but slightly larger than, the OD of ferrule 141.

Ferrule 141 (and thus fiber 140 and fiber end 140b) is supported, during active alignment of the laser and fiber, by support arm 145, which is fixedly secured to ferrule 141. Support arm 145 is supported by an external support/movement means, which may be manual or mechanical. For example, support arm 145 may be attached to a precision adjustment mechanism and TO can housing 101 attached to another portion of the mechanism, so that the ferrule 141 may be carefully and precisely positioned with respect to each other, e.g. by turning various positioning knobs on the mechanism.

In terminology used to describe characteristics of threads, the major diameter of the thread is the largest diameter of the thread, i.e. the diameter from crest to crest for an external thread and the diameter from root to root for an internal thread. Conversely, the minor diameter for a thread is the smallest diameter of the thread, i.e. the diameter from root to root for an external thread and the diameter from crest to crest for an internal thread. For a tapered thread, the major and minor diameter varies with axial position along the thread. The root is the surface of the thread corresponding to the minor diameter of an external thread and the major diameter of an internal thread, and the crest is the surface of the thread corresponding to the major diameter of an external thread and the minor diameter of an internal thread.

Ferrule housing 142 is externally threaded with threads 143. The threaded portion of the external profile of annular ferrule housing 142 is axially tapered such that the major diameter of the external threads 143 decreases substantially linearly along the axis of the housing (the z axis), from a first major diameter at the axially upper or top portion 143a of threads 143 to a second, comparatively smaller, major diameter at the lower or bottom portion 143b of threads 143. In alternative embodiments, the major diameter of the external threads 143 does not decrease linearly along the axis of the housing, but does decrease monotonically, e.g. parabolically or hyperbolically. The terms "tapered threads" or "tapered threaded ferrule housing" and related terms as used herein means that the major diameter of the external threads 143 decreases monotonically (whether linearly or not) along with the axis of ferrule housing 142, from a first major diameter at top portion 143a to second, relatively smaller major diameter at bottom portion 143b.

Cylindrical walls 131 of TO can housing 101 have an internally threaded opening with internal threads 132, for threaded mating with the external, tapered ferrule housing threads 143. The diameter of threads 132 is preferably axially constant, and is sized for engagement (mating) with the externally threaded portion of the ferrule housing 142. Thus, ferrule housing 142 is externally threaded with axially tapered threads 143 configured to threadedly engage with internal threads 132 defining the opening of TO can housing cylindrical walls 131.

Threads are typically characterized by a variety of features or characteristics, such as the pitch (the distance from a point on a screw thread to a corresponding point on the next thread, measured parallel to the axis), thread depth (the distance from the root of a thread to the crest, measured perpendicularly to the axis), and thread (or groove) angle. For threads to threadedly engage with each other, they must have sufficiently similar characteristics, in which case they may be referred to in this application as being threadably compatible. Thus, an externally threaded member can be threadedly engaged with an internally threaded member if the threads' diameters are similar and the threads are threadably compatible with each other. In the present invention, the internal and external threads 132, 143 are threadably compatible, i.e. they have pitch, thread depth, and thread angle sufficiently similar so as to permit threaded engagement.

In an embodiment, both the first and second major diameters of external threads 143 are larger than the minor diameter of internal threads 132, thus permitting threaded engagement between the internal and external threads. The first major diameter of the external threads 143 may be larger, or smaller, than the major diameter of internal threads 132, in various embodiments.

When ferrule housing 142 is centered with respect to housing walls 131 (i.e., they are coaxial), substantially circumferentially symmetrical threaded engagement between internal threads 132 and external threads 143 occurs when bottom portion 143b of external threads 143 is proximate with the top portion 132a of internal threads 132. However, because the second major diameter of external threads 143 is smaller than the first major diameter, initially there will be a comparatively larger annular gap between threads 132, 143, and comparatively loose threaded engagement. As ferrule housing 142 is threaded axially further down into housing walls 131, the annular gap between external threads 143 and internal threads 132, at top portion 132a, will decrease.

The use of a tapered, externally threaded ferrule housing permits the second major diameter of the external threads 143 to result in an initially very loose threaded engagement with internal threads 132 (i.e., a larger annular gap). The external thread major diameter as seen at the top portion 132a of internal threads 132 increases as the ferrule housing is threaded axially lower into the TO can housing. Thus, in the coaxially centered case, initially loose threaded engagement becomes tighter, and the initially large annular gap becomes smaller, the farther that ferrule housing 143 is threaded into housing 131. As will be described in further detail below, this will permit a greater tolerance of alignment positioning and/or more secure, stronger attachment of ferrule housing to TO can housing, than if ferrule housing 142 were not threadedly tapered in this manner.

In order to securely align and mount fiber 140 with respect to laser 122 so that laser 122 is optically coupled to fiber 140, the fiber 140 must first be actively aligned with laser 122. After the correct alignment is achieved, fiber 140 must be securely fixed at this position with respect to laser 122, so that alignment, and thus optical coupling, may be maintained after the active alignment procedure. Thus the alignment process includes finding the right position (active alignment) of laser with respect to fiber and then fixedly securing the fiber and laser to maintain the alignment.

Figure 2:
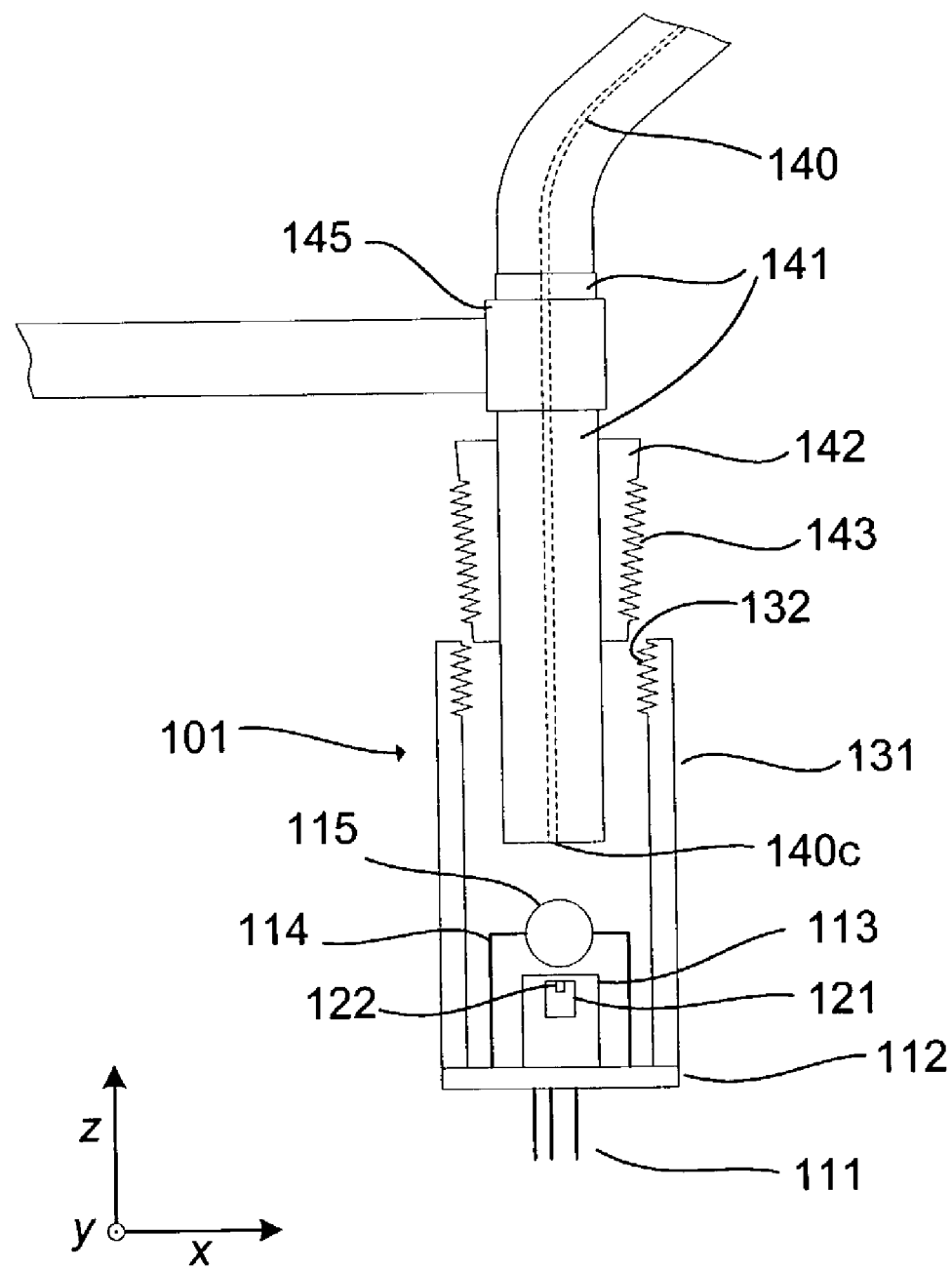
FIGS. 2–4 are cross-sectional views of the assembly of FIG. 1 illustrating different stages of alignment of the laser with the fiber, in accordance with an embodiment of the present invention.
Figure 3:
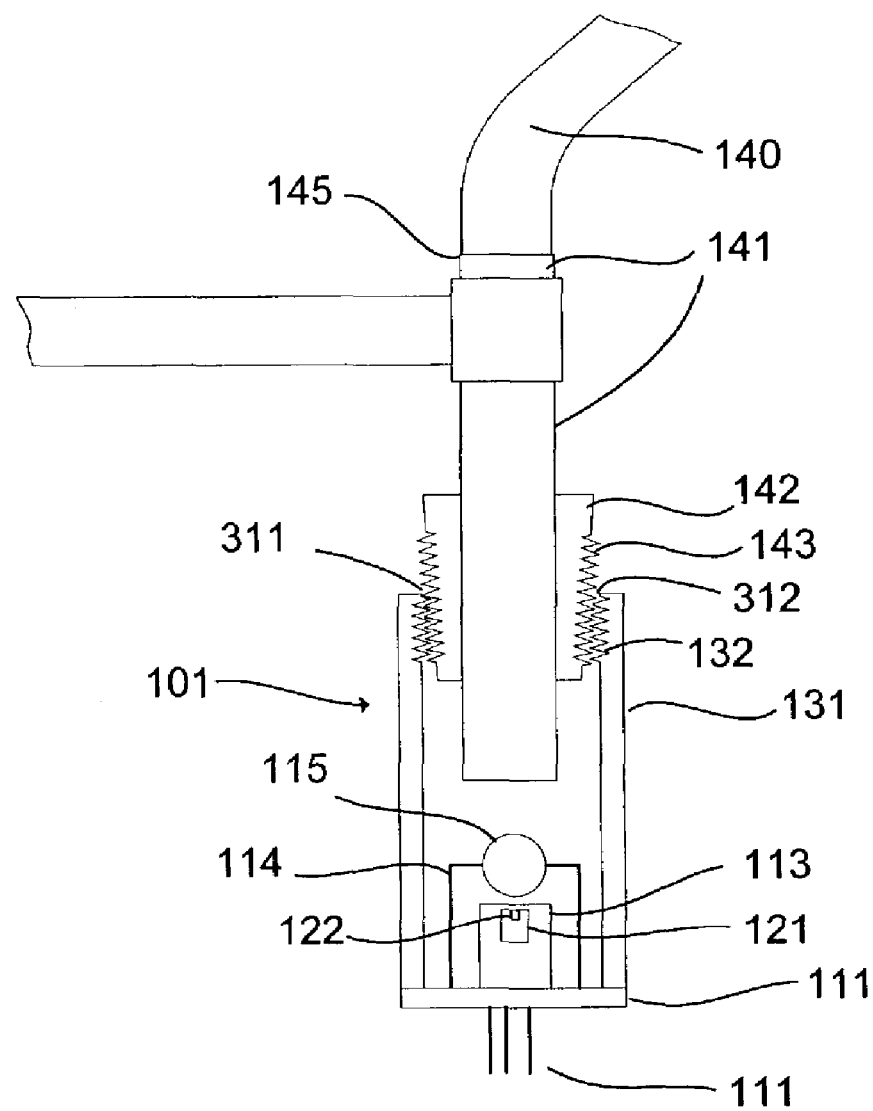
Figure 4:
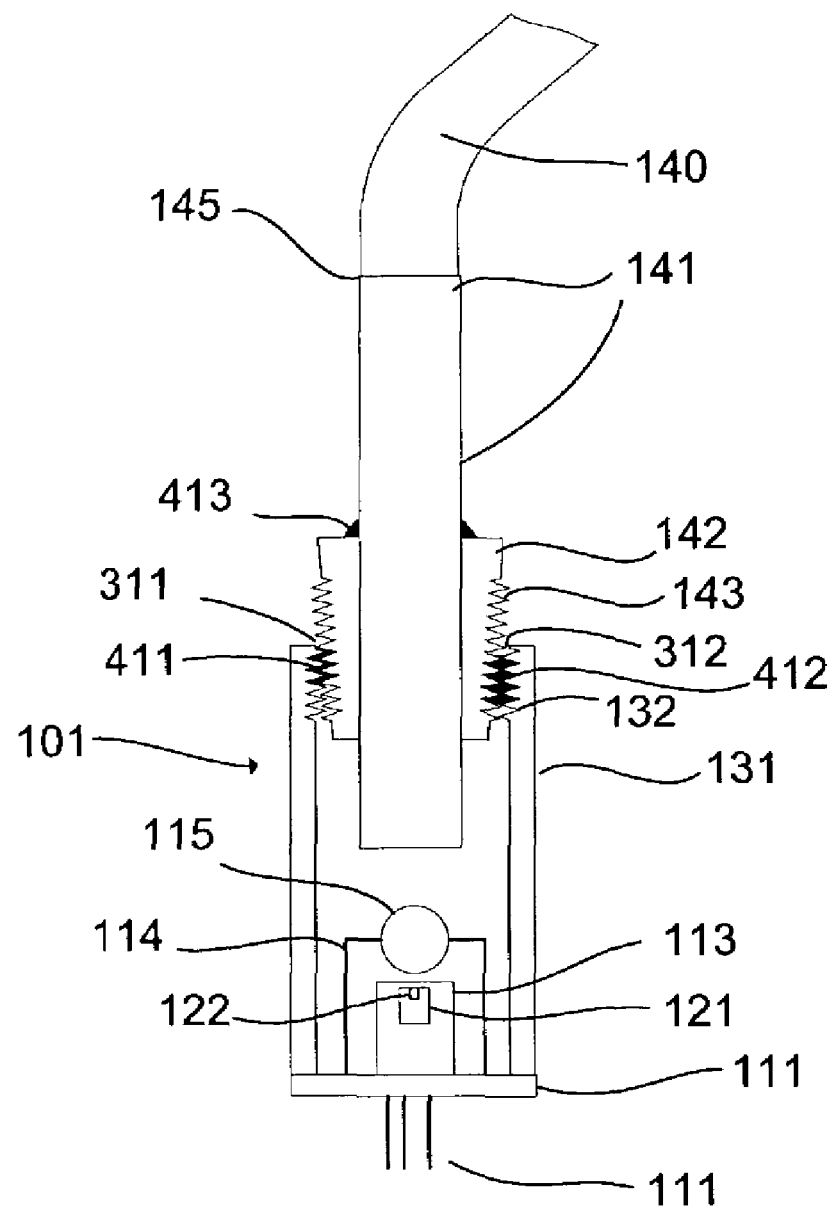

Referring now to FIGS. 2–4, there are shown cross-sectional views of assembly 100 of FIG. 1 illustrating different stages of alignment of laser 122 with fiber 140, in accordance with an embodiment of the present invention. First, support arm 145 is used to lower fiber end section 140b down into the inner region of cylindrical walls 131 of TO can housing 101, thus bringing the input end 140c closer to lens 115 and laser 122. During this active alignment phase, laser 122 is powered on and the signal emitted out of the other end of fiber 140 (not shown) is monitored. The position of fiber end 140c is adjusted, with respect to lens 115, by moving support arm 145 in x, y, and z directions, until the desired optical coupling is achieved. The view shown in FIG. 2 illustrates such a possible alignment position which achieves optical coupling. As can be seen, the input end 140c of fiber 140 is closer to lens 115 and laser 122 than in FIG. 1 (drawings not to scale). At this point, the ferrule housing 142 is still near the top portion of ferrule 141, and outside TO can housing 101 (i.e., the bottom portion 143b of external threads 143 is axially above the top portion 132a of internal threads 132).

The aligned position may result in ferrule 141 being axially off-center (i.e., in the x or y direction, non-coaxial) with respect to the central z-axis of the cylindrical walls portion 131 of TO can housing 101, as in the example illustrated in FIGS. 2–4. There may be several reasons for this. For example, lens 115 and/or laser 122 may not be mounted in the exact axial center of TO can housing 101. This may require an off-center alignment, so that the ferrule 141, and thus ferrule housing 142, is not uniformly close to the interior walls of cylindrical walls 131.

In order to fixedly secure fiber end 140c with respect to laser 122 and lens 115 in the aligned position, to complete the alignment process, ferrule housing 142 is carefully lowered with respect to ferrule 141, bringing bottom portion 143b of external threads 143 proximate to top portion 132a of internal threads 132.

Ferrule 141 and fiber 140 are maintained in their position by keeping support arm 145 fixed with respect to TO can housing 101, while ferrule housing 142 is threaded into TO can housing 101. In both the coaxial (centered) and non-coaxial (non-centered) case, ferrule housing 142 is threaded into threaded engagement into the TO can housing 101 as far as possible, for a more secure threaded engagement, but with the threaded engagement being loose enough so that a circumferential annular gap exists between the two sets of threads 132, 142 around the entire circumference of the threads. The presence of the circumferential annular gap will permit an adhesive such as epoxy or glue to be applied between the threads 132, 142, around their entire circumference. (In an alternative embodiment, in the non-coaxial case, ferrule housing 142 is threaded into threaded engagement into the TO can housing 101 as far as possible, bringing threads 132, 143 into actual contact on the closest side, so that there is a gap between the threads for part of the circumference but virtually no gap at location 311.)

In the coaxial case, the annular gap is substantially symmetrical, so that the distance between external ferrule housing threads 143 and internal threads 132 is about the same, around the circumference. In the non-coaxial case, as illustrated in FIG. 3, the annular gap is asymmetric, having a comparatively smaller gap section 311 where external ferrule housing threads 143 are closer to internal threads 132, and a comparatively larger gap section 312, on the opposite side.

After ferrule housing 142 is threaded into TO can housing 101, epoxy is preferably applied around the entire circumference of the annular gap formed between the two sets of threads 132, 142. The epoxy will fill the relatively smaller gap section 311 as well as the relatively larger gap section 312, as illustrated in FIG. 4. Alternatively, other adhesives such as glue may also be employed, or the epoxy may be applied around only parts of the circumference of the annular gap instead of around the entire circumference.

Because of the tapered, threaded design of ferrule housing 142, the smaller-diameter bottom threaded portion 143b of ferrule housing 142 will be able to threaded into TO can housing 101, even if ferrule 141 is not perfectly coaxial with cylindrical TO can housing walls 131. The annular gap will be asymmetrical, but there will still be threaded engagement. Because both the smaller second major diameter, and the larger first major diameter, of external threads 143 are the appropriate diameter to threadedly engage with internal threads 132, there is more "play" or "tolerance" for non-coaxial alignment as between the smaller second major diameter of external threads 143 and internal threads 132, than as between the larger first major diameter of external threads 143 and internal threads 132. This permits there to be threaded engagement, albeit asymmetrical, even when the ferrule housing is not coaxial with TO can housing walls 131, and for the highest degree of threaded engagement to be achieved, given the existing degree of non-centered alignment, by threading the ferrule housing as far down into the TO can as the non-centered alignment will permit (while still leaving the desired annular gap for epoxy application purposes). Further, even if the annular gap is not symmetrical, there is threaded engagement around the entire circumference of ferrule housing 143, which will reduce or prevent epoxy from falling into the interior of TO can housing 101 better than if there were no threads present.

As described above, the tapering of external threads 143 and the outer profile of ferrule housing 142 provides a greater tolerance of alignment positioning and/or more secure, stronger attachment of ferrule housing to TO can housing, than if cylindrical and unthreaded ferrule housing was used. The lack of threads would not prevent epoxy from falling into the housing, or would require some attachment technique other than epoxy, such as laser welding. Even if external threads were disposed on a cylindrical and non-tapered ferrule housing, then its threads would either have (a) a larger diameter (closer to the first major diameter of external threads 143) to ensure better threaded mating with TO can housing threads 132, but at the cost of being unable to achieve any threaded engagement if there is any off-axis alignment; or (b) a smaller diameter (closer to the second major diameter of external threads 143) for greater tolerance of off-axis alignment, but at the cost of larger annular gaps and/or less-secure threaded engagement.

For example, a threaded, cylindrical ferrule housing sized to match the inner threaded opening of a TO can housing may achieve good threaded engagement if the ferrule housing is almost perfectly coaxial with the TO can housing, but off-axis alignment may prevent the ferrule housing from fitting into the TO can housing at all. If a smaller-diameter cylindrical ferrule housing is used instead, to avoid this tolerance problem, then if the ferrule housing is coaxially centered, there will be very loose or no threaded alignment and a corresponding large (symmetrical) circumferential gap between the threads. This would mean less secure, less strong attachment after application of epoxy and a diminished ability to prevent epoxy from falling into the interior of the TO can housing during the epoxy application steps.

In the present invention, however, because of the tapered, threaded design of ferrule housing 142, if active alignment of laser 122 and fiber 140 results in fiber 140 being coaxial with TO can housing 101, then ferrule housing 142 can be threaded farther down into TO can housing 101 until tighter threaded engagement is achieved. This would achieve a result similar to that would be achieved if a perfectly-sized and threaded cylindrical ferrule housing were employed. If, on the other hand, fiber 140 is aligned so that ferrule 141 is axially off-center (non-coaxial), ferrule housing 142 can still be brought into threaded engagement.

Thus, for a given alignment and positioning of ferrule 141 with respect to TO can housing 101, ferrule housing 142 is threaded as far as possible axially into TO can housing 101, while still leaving an annular gap large enough to receive epoxy between the threads. As shown in FIG. 4, once ferrule housing 142 has been threaded TO can housing walls 131, ferrule 141 and ferrule housing 142 need to be secured into position with respect to TO can housing 101, to maintain the current aligned position of fiber end 140c with respect to the combination of lens 115 and laser 122. To achieve this, ferrule 141 needs to be secured with respect to ferrule housing 142 so that ferrule 141 cannot move axially with respect to ferrule housing 142. Therefore, an adhesive such as epoxy 413 can be applied to secure ferrule 141 with respect to ferrule housing 142. Alternatively, laser welding may be employed for this purpose.

Epoxy 411 and 412 may be applied between threads at regions 311, 312, as illustrated, to secure ferrule housing 142 with respect to TO can housing 101. This secures fiber 140 into the aligned position with respect to laser 122 and lens 115, thus completing the aligning process and permitting laser 122 to be optically coupled into fiber 140.

As will be appreciated, the use of threads 132, 143 helps enhance the strength of the bond between ferrule housing 142 and TO can housing 101, and also helps to prevent epoxy from falling into the interior of TO can housing 101. The tapering of threads 143 and outer profile of ferrule housing 142 provides a greater tolerance of alignment positioning, as described above.

In an embodiment, the components of assembly 100 have the following dimensions: the inner diameter (ID) of ferrule housing 142 is approximately 2.55 mm, slightly larger than the 2.50 mm outer diameter (OD) of ferrule 141, so that it can be moved axially up and down ferrule 141; the ID of ferrule 141 (the diameter of its through-hole) and OD of fiber 140 are each approximately 0.125 mm. The axial length of external ferrule housing threads 143 is about 5 mm. The first major diameter of external threads 143 is about 5.076 mm. The major diameter of external threads 143 uniformly (linearly) decreases from the first major diameter so that the second major diameter of external threads 143 is about 0.60 mm smaller than the first major diameter, i.e. about 4.476 mm. The threads may have any suitable pitch, e.g. they may be 8–32 or M5 type threads (as noted above, the dimensions shown in the Figs. are not necessarily to scale; e.g., the angle of threads 132, 142 are exaggerated in Figs. for illustrative purposes relative to some preferred embodiments). The axial length of the internal TO can housing threads 132 is about 3 mm. The total length of the TO can housing walls 131 is about 10 mm, where lens 115 is an aspherical lens; if a smaller, ball lens is used instead for lens 115, TO can housing walls 131 may be shorter, e.g. about 6.4 mm. The OD of the TO cylindrical walls 131 is about 6.25 mm, and the ID is about 4.8 mm. The major diameter of internal threads 132 is approximately 4.8 mm, and the minor diameter of internal threads 132 is approximately 4.2 mm.

In an alternative embodiment, while the first major diameter of external threads 143 is larger than the minor diameter of internal threads 132, the second major diameter of external threads 143 is smaller than the minor diameter of internal threads 132, for greater alignment tolerance. This would require, in the coaxial case, that the ferrule housing be lowered with no initial threaded engagement into the TO can housing, until the external thread diameter as seen by the internal threads is large enough for threaded engagement.

In an alternative embodiment, although the tapered feature is preferred, a non-tapered, threaded ferrule housing may be employed. Such an embodiment will have less tolerance of non-centered alignment of the ferrule 141, but will still achieve some of the advantages noted above, such as increased bond strength due to threads and reduction in epoxy falling into the interior of TO can housing 101 than if no threads were employed.

The present invention, therefore, is well adapted to carry out the objects and attain the ends and advantages mentioned, as well as others inherent therein. While the invention has been depicted and described and is defined by reference to particular preferred embodiments of the invention, such references do not imply a limitation on the invention, and no such limitation is to be inferred. The invention is capable of considerable modification, alteration and equivalents in form and function, as will occur to those ordinarily skilled in the pertinent arts. The depicted and described preferred embodiments of the invention are exemplary only and are not exhaustive of the scope of the invention. Consequently, the invention is intended to be limited only by the spirit and scope of the appended claims (if any), giving full cognizance to equivalents in all respects.

What is claimed is:

1. An assembly for improved alignment of a laser for generating laser light with an optical fiber having an end section terminating in a light-receiving end, the assembly comprising:

(a) a laser housing comprising a base and substantially cylindrical housing walls mounted at a bottom portion to the base, wherein the base is for receiving the laser and the housing walls have a substantially cylindrical internal surface having internal threads at a top portion thereof, the internal threads having a minor diameter and a major diameter; and (b) an annular ferrule housing having a substantially cylindrical through-hole having an inner diameter (ID) sufficient to receive a fiber ferrule having the end section of the fiber disposed therein, the ferrule housing further having an axially tapered external surface having external threads that are threadably compatible with the internal threads, wherein the major diameter of the external threads decreases monotonically from a first major diameter at a top portion of the external surface to a comparatively smaller second major diameter at a bottom portion of the external surface, wherein the first major diameter of the external threads is larger, and the second major diameter of the external threads is smaller, than the minor diameter of the internal threads;

wherein the ID of the ferrule housing is approximately 2.55 mm, the outer diameter (OD) of the fiber ferrule is approximately 2.50 mm, the ID of the fiber ferrule and the OD of the fiber are each approximately 0.125 mm, the first major diameter of the external threads is approximately 5.076 mm, the second major diameter of the external threads is approximately 4.476 mm, the OD of the housing walls is approximately 6.25 mm, the ID of the housing walls is approximately 4.8 mm, the major diameter of the internal threads is approximately 4.8 mm, and the minor diameter of the internal threads is approximately 4.2 mm.

2. The assembly of claim 1, wherein the external surface of the ferrule housing is substantially linearly tapered such that the major diameter of the external threads decreases substantially linearly along the axis of the ferrule housing from the first major diameter to the second major diameter.

3. The assembly of claim 1, wherein the external and internal threads are type 8–32 threads.

4. The assembly of claim 1, wherein the fiber ferrule is a rigid cylindrical ceramic ferrule.

5. The assembly of claim 1, wherein the axial length of the external threads is approximately 5 mm, the axial length of the internal threads is approximately 3 mm, and the axial length of the housing walls ranges from approximately 6.4 mm to approximately 10 mm.

6. The assembly of claim 1, further comprising the fiber ferrule.

7. The assembly of claim 1, wherein the laser housing is a TO can housing.

8. The assembly of claim 7, wherein the TO can housing farther comprises a TO can mounted to the base, the TO can having a TO can header and TO cap, the TO can header comprising a TO can post mounted to the base and electrical connection pins which are electrically connected to the TO can post and which extend through the base, wherein the TO cap is mounted on the base over the TO can post, wherein the TO can post is for receiving a laser submount having the laser mounted thereon and the TO cap has a central opening in a top portion thereof, above the TO can post, for receiving a lens, whereby, when the laser and the laser submount are mounted on the TO can post and the lens is disposed in the central opening, the laser emits output laser radiation, during operation thereof, into the lens.

9. The assembly of claim 8, wherein the axial length of the external threads is approximately 5 mm, the axial length of the internal threads is approximately 3 mm, and the axial length of the housing walls ranges from approximately 6.4 mm to approximately 10 mm.

10. The assembly of claim 9, wherein the lens is an aspherical lens and the axial length of the housing walls is approximately 10 mm.

11. The assembly of claim 9, wherein the lens is a ball lens and the axial length of the housing walls is approximately 6.4 mm.

12. The assembly of claim 8, further comprising the fiber ferrule, the fiber, and the laser.

13. The assembly of claim 1, further comprising the fiber ferrule, the fiber, and the laser.

14. The assembly of claim 1, wherein the ID of the annular ferrule housing is slightly larger than the OD of the fiber ferrule so as to be able to receive tile fiber ferrule and permit the ferrule housing to be moved axially along the fiber ferrule.

15. An assembly for improved alignment of a laser for generating laser light with an optical fiber having an end section terminating in a light-receiving end, the assembly comprising:

(a) a laser housing means comprising a base means for receiving the laser and housing walls means having internal thread means; and (b) a ferrule housing means for receiving a fiber ferrule having the end section of the fiber disposed therein, the ferrule housing means comprising tapered external thread means for mating with the internal thread means, wherein the major diameter of the external thread means decreases monotonically from a first major diameter at a top portion thereof to a comparatively smaller second major diameter at a bottom portion thereof, wherein the first major diameter of the external thread means is larger, and the second major diameter of the external thread means is smaller, than the minor diameter of the internal thread means;

wherein the ID of the ferrule housing is approximately 2.55 mm, the outer diameter (OD) of the fiber ferrule is approximately 2.50 mm, the ID of the fiber ferrule and the OD of the fiber are each approximately 0.125 mm, the first major diameter of the external threads is approximately 5.076 mm, the second major diameter of the external threads is approximately 4.476 mm, the OD of the housing walls is approximately 6.25 mm, the ID of the housing walls is approximately 4.8 mm, the major diameter of the internal threads is approximately 4.8 mm, and the minor diameter of the internal threads is approximately 4.2 mm.

16. An assembly for improved alignment of a laser for generating laser light with an optical fiber having an end section terminating in a light-receiving end, the assembly comprising:

(a) a laser housing comprising a base and substantially cylindrical housing walls mounted at a bottom portion to the base, wherein the base is for receiving the laser and the housing walls have a substantially cylindrical internal surface having internal threads at a top portion thereof, the internal threads having a constant minor diameter and a major diameter; and (b) an annular ferrule housing having a substantially cylindrical through-hole having an inner diameter (ID) sufficient to receive a fiber ferrule having the end section of the fiber disposed therein, the ferrule housing further having an axially tapered external surface having external threads that are threadably compatible with the internal threads, wherein the major diameter of the external threads decreases monotonically from a first major diameter at a top portion of the external surface to a comparatively smaller second major diameter at a bottom portion of the external surface, wherein the first major diameter of the external threads is larger, and the second major diameter of the external threads is smaller, than the minor diameter of the internal threads.

* * * * *